(12) United States Patent
Bouche

(10) Patent No.: US 10,347,583 B1
(45) Date of Patent: Jul. 9, 2019

(54) METHODS OF PATTERNING DIELECTRIC LAYERS FOR METALLIZATION AND RELATED STRUCTURES

(71) Applicant: GLOBALFOUNDRIES Inc., Grand Cayman (KY)

(72) Inventor: Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/860,193

(22) Filed: Jan. 2, 2018

(51) Int. Cl.
*H01L 21/768* (2006.01)
*H01L 23/538* (2006.01)
*H01L 23/522* (2006.01)

(52) U.S. Cl.
CPC .... *H01L 23/5384* (2013.01); *H01L 21/76816* (2013.01); *H01L 21/76897* (2013.01); *H01L 23/5226* (2013.01); *H01L 23/5386* (2013.01)

(58) Field of Classification Search
None
See application file for complete search history.

(56) References Cited

U.S. PATENT DOCUMENTS 6,852,620 B2 * 2/2005 Kim ................. H01L 21/76229
                                                              438/637
8,932,955 B1 * 1/2015 Sel ........................ H01L 21/308
                                                              438/694
9,406,511 B2 * 8/2016 Huang ................ H01L 21/0332
9,818,640 B1   11/2017 Stephens et al.
9,818,641 B1   11/2017 Bouche et al.

OTHER PUBLICATIONS

Yaegashi et al., "Novel approaches to implement the self-aligned spacer double-patterning process toward 11-nm node and beyond", Proc. SPIE 7972, Advances in Resist Materials and Processing Technology XXVIII, Apr. 16, 2011.

* cited by examiner

*Primary Examiner* — Chandra Chaudhari
(74) *Attorney, Agent, or Firm* — Thompson Hine LLP; Anthony Canale

(57) ABSTRACT

Structures including metallization layers and metal lines, and methods of forming thereof. A patterning stack, a masking layer, and a spacer patterning layer are formed over a dielectric layer, and an opening is formed in the spacer patterning layer. First and second spacers are formed on a portion of the masking layer at sidewalls of an opening in the spacer patterning layer. The first spacer and the second spacer overlie and traverse first portions of the dummy line. After removing the spacer patterning layer and masking layer, second portions of the dummy line are removed to form a feature in the patterning stack that includes a first gap beneath the first spacer and a second gap beneath the second spacer. A metal line is formed in the dielectric layer using the feature, and includes cuts at the first gap and the second gap in the feature.

16 Claims, 11 Drawing Sheets

METHODS OF PATTERNING DIELECTRIC LAYERS FOR METALLIZATION AND RELATED STRUCTURES

BACKGROUND

The present invention relates to semiconductor device fabrication and integrated circuits and, more specifically, to methods of patterning dielectric layers for metal line formation and fabrication of metallization layers integrated circuits.

Metallization layers in integrated circuits allow for electrical connection between layers of integrated circuits and external devices. As circuit sizes have continued to shrink, new methods for patterning metallization layers and forming metallization lines continue to be developed to overcome limitations of existing fabrication equipment in meeting design requirements for newer and even smaller metal line features.

SUMMARY

In an embodiment of the invention, a method includes forming a patterning stack over a dielectric layer, forming a masking layer over the patterning stack and a spacer patterning layer over the masking layer, and etching an opening in the spacer patterning layer to expose a portion of the masking layer overlying a dummy line of the patterning stack. The method further includes forming a first spacer and a second spacer on the exposed portion of the masking layer at sidewalls of the opening. The first spacer and the second spacer overlie and traverse respective first portions of the dummy line. The method further includes removing the spacer patterning layer and the masking layer selective to the patterning stack, the first spacer, and the second spacer to expose second portions of the dummy line, and removing the second portions of the dummy line selective to the first spacer and the second spacer to form a feature in the patterning stack that includes a first gap beneath the first spacer and a second gap beneath the second spacer. A metal line is formed in the dielectric layer using the feature in the patterning stack. The metal line includes respective cuts at the first gap and the second gap in the feature in the patterning stack.

In another embodiment of the invention, a structure includes a first metallization layer including a plurality of first metal lines and a metal island, a second metallization layer including a second metal line arranged or disposed below the first metallization layer, and a third metallization layer including a third metal line arranged or disposed above the first metallization layer. A first conductive via connects the metal island to the second metal line and a second conductive via connects the metal island to the third metal line. The first conductive via, second conductive via, and metal island provide electrical connectivity between the second metal line and third metal line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1A is a top view of the structure in which FIG. 1 is taken generally along line 1-1.

FIG. 3A is a top view of the structure in which FIG. 3 is taken generally along line 3-3.

FIG. 6A is a top view of the structure in which FIG. 6 is taken generally along line 6-6.

FIG. 7A is a top view of the structure in which FIG. 7 is taken generally along line 7-7.

FIG. 8A is a top view of the structure in which FIG. 8 is taken generally along line 8-8.

FIG. 9A is a top view of the structure in which FIG. 9 is taken generally along line 9-9.

FIG. 10A is a top view of the structure in which FIG. 10 is taken generally along line 10-10.

FIG. 11A is a top view of the structure in which FIG. 11 is taken generally along line 11-11.

DETAILED DESCRIPTION

Figure 1:
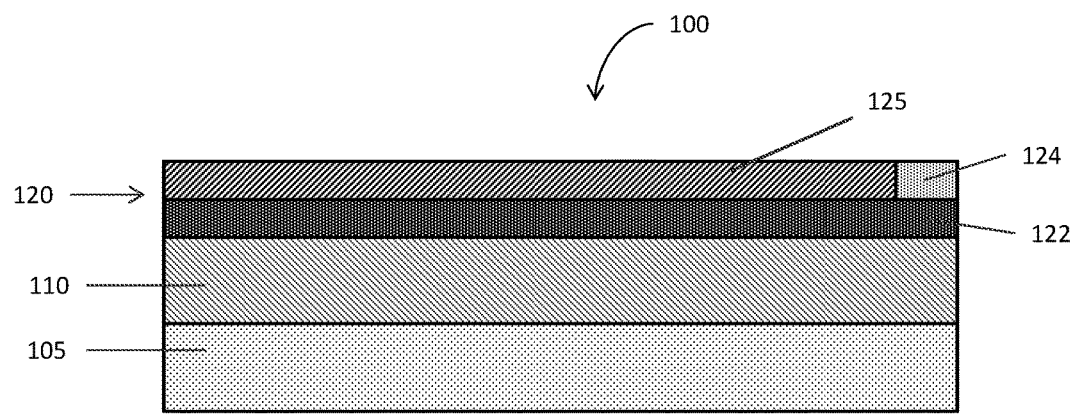
FIGS. 1-10 are cross-sectional views of a structure at successive fabrication stages of a processing method in accordance with embodiments of the invention.
Figure 1A:
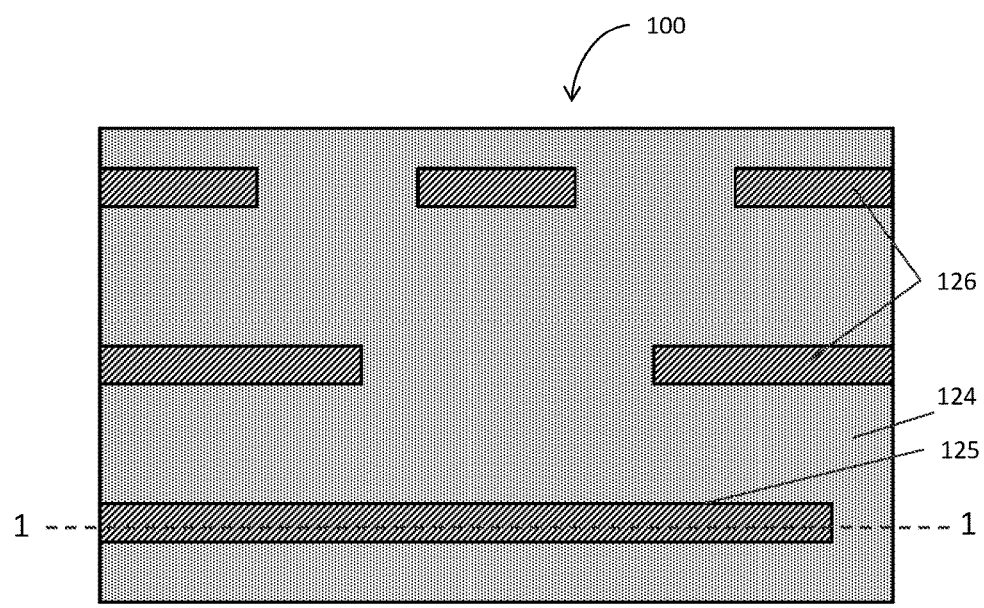

With reference to FIGS. 1 and 1A and in accordance with embodiments of the invention, a structure 100 includes one or more lower circuit structure layers 105, a dielectric layer 110, and a patterning stack 120 that includes a hardmask layer 122, a dielectric layer 124, and dummy lines 125, 126. Dummy lines 125, 126 may be formed by a lithography and etch process from a deposited layer of its material. Dummy lines 125, 126, which may be composed of a sacrificial material, such as amorphous silicon (a-Si), are embedded in the dielectric layer 124. Dummy lines 126 are patterned with large tip-to-tip spacings.

Dielectric layer 124 may be composed of, for example, silicon dioxide deposited by plasma-enhanced chemical vapor deposition (PECVD) on the hardmask layer 122 and over the dummy lines 125, 126, and then polished to exposed the dummy lines 125, 126 at the top surface of the dielectric layer 124. Hardmask layer 122 may be composed, for example, of titanium nitride, titanium oxide, or other hardmask material. Dielectric layer 110 may be composed of a dielectric material, such as an oxide of silicon or a nitride of silicon, in which metallization lines are to be patterned using patterning stack 120, as described in part below.

Figure 2:
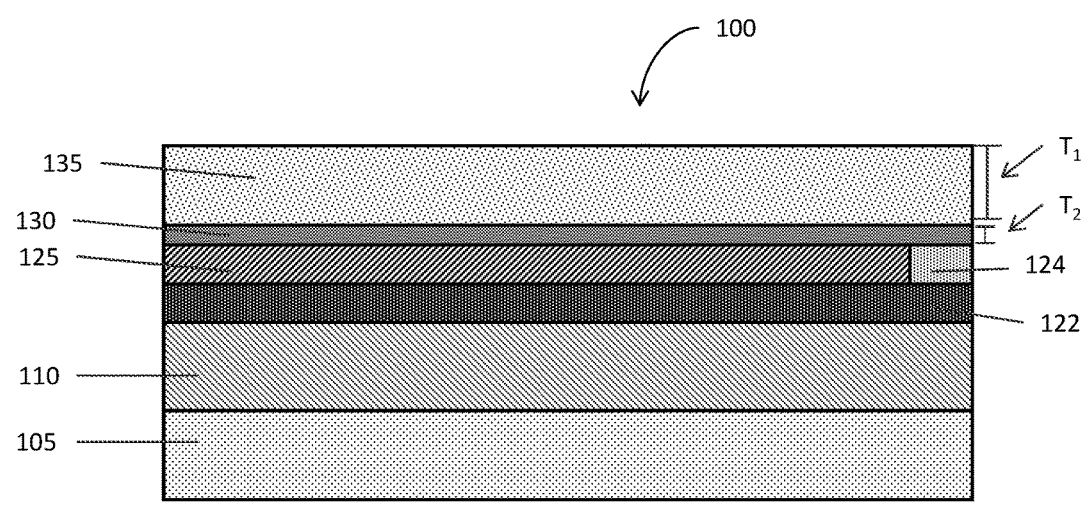

With reference to FIG. 2 in which like reference numerals refer to like features in FIGS. 1 and 1A and at a subsequent fabrication stage of the processing method, a masking layer 130 and a spacer patterning layer 135 are formed over the patterning stack 120. Masking layer 130 may be composed of a dielectric material, such as a nitride-based dielectric material, and spacer patterning layer 135 may be composed of a different dielectric material from masking layer 130, such as an oxide-based dielectric material, so that masking layer 130 and spacer patterning layer 135 have differing etch selectivity properties. For example, masking layer 130 may be composed of silicon nitride and spacer patterning layer 135 may be composed of silicon dioxide. Spacer patterning layer 135 may be formed to a selected thickness $T_1$ that may, in part, facilitate formation of spacers as described further below. Masking layer 130 may have a thickness $T_2$ that is less than the thickness $T_1$ of spacer patterning layer 135. The thickness $T_1$ of spacer patterning layer 135 may, as described below, partially define a height of spacers 151 and 152 formed on sidewalls of an opening 137 (FIG. 4) patterned in the spacer patterning layer 135.

Figure 3:
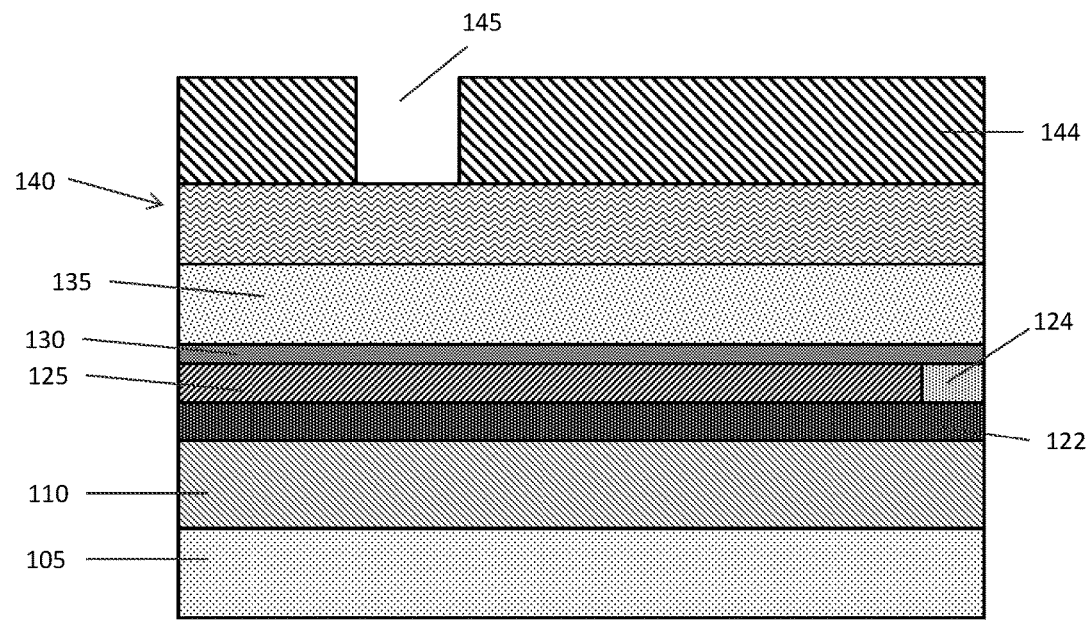
Figure 3A:
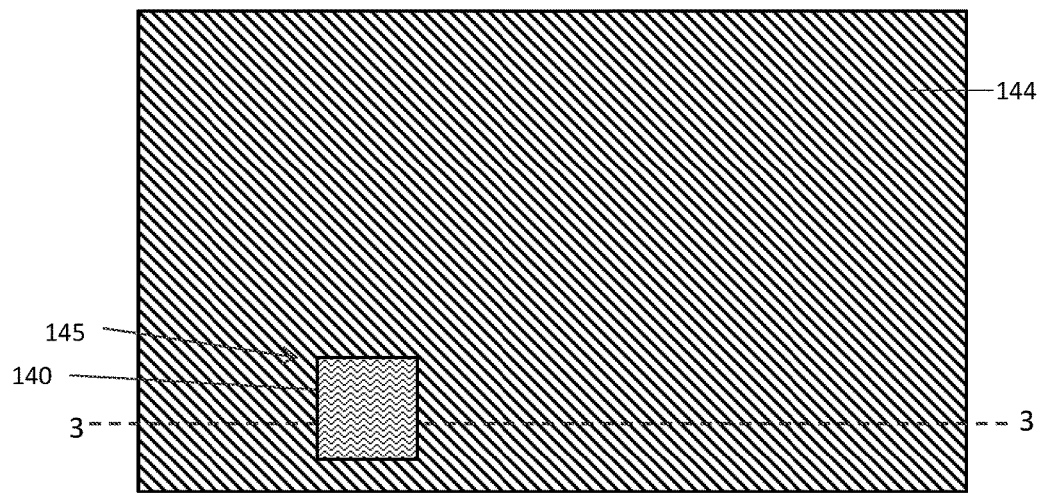

With reference to FIGS. 3 and 3A and in which like reference numerals refer to like features in FIG. 2 and at a subsequent fabrication stage of the processing method, a lithography stack 140 and a resist layer 144 are formed over spacer patterning layer 135. Lithography stack 140 may include an organic spin-on hardmask (SOH) layer, a silicon oxynitride (SiON) hardmask layer, and an anti-reflective coating layer. The resist layer 144 is patterned to form an opening 145, or multiple openings as described below, aligned over portions of dummy line 125 that is designated to be cut to provide small tip-to-tip spacings. The opening 145 exposes a portion of spacer patterning layer 135 to be etched and removed as described below.

Figure 4:
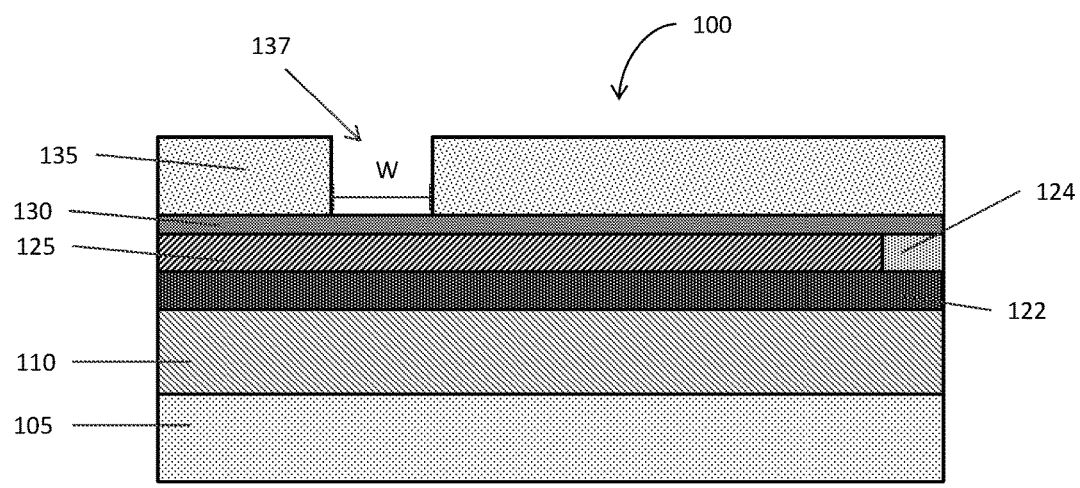
Figure 5:
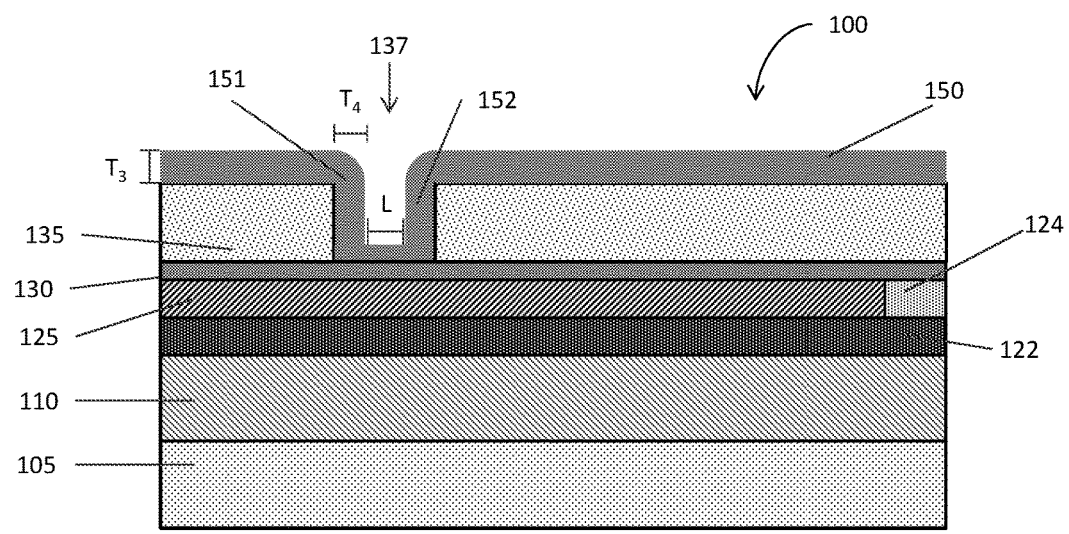

With reference to FIG. 4 in which like reference numerals refer to like features in FIGS. 3 and 3A and at a subsequent fabrication stage of the processing method, an opening 137 is etched in spacer patterning layer 135. Opening 137 may be formed, for example, by a reactive ion etch (ME) process. The opening 137 may have a width dimension W that is about equal to twice a selected thickness $T_3$ of a conformal layer 150 to be formed over spacer patterning layer 135 plus a length L separating a spacer 151 from a spacer 152 (which are formed from conformal layer 150) as shown in FIG. 5. For example, selected thickness $T_3$ of conformal layer 150 may be about 5 nm, and length L separating spacers 151 and 152 may be about 15 nm, so that width W of opening 137 may be about 25 nm. The etching may be a selective etch process that is controlled to remove the exposed portion of spacer patterning layer 135 and to terminate on the material of the masking layer 130. The opening 137 exposes a portion of masking layer 130 overlying a portion of dummy line 125. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The opening 137, which is a single opening of relatively large dimensions in the spacer patterning layer 135, may be used to form multiple closely-spaced cuts, as subsequently described, in contrast with conventional techniques that require multiple "colors" or stages of patterning to form closely-spaced cuts of small relative dimensions. In addition, the spacing between adjacent conventional cuts may be limited due to lithography resolution limits, which is mitigated through the use of spacers as described below.

With reference to FIG. 5 in which like reference numerals refer to like features in FIG. 4 and at a subsequent fabrication stage of the processing method, a conformal layer 150 is deposited on the spacer patterning layer 135 and over the sidewalls and base of the opening 137 in spacer patterning layer 135. The sections of conformal layer 150 deposited on sidewalls of opening 137 define a spacer 151 and a spacer 152. As depicted and described below in FIG. 6A, spacer 151 and spacer 152 may be included among a plurality of spacers that are arranged to form a "spacer ring" 155 on the sidewalls of the opening 137. As also described and depicted below in FIG. 6A, spacer 151 and spacer 152 overlie and traverse dummy line 125. The thickness $T_1$ of spacer patterning layer 135 may define, at least in part, a height of spacers 151 and 152 formed on sidewalls of the opening 137 of spacer patterning layer 135. The thickness $T_3$ of the conformal layer 150 may be selected to determine a thickness $T_4$ of spacers 151 and 152 and may further define, at least partially, a length L separating spacer 151 and spacer 152. The thickness $T_4$ of spacer 151 and of spacer 152 may also define a size of gaps separating ends of metal lines formed in dielectric layer 110, as described further below. For example, a conformal layer 150 having a thickness $T_3$ of 5 nm may form spacers 151, 152 having thickness $T_4$ of 5 nm, so that gaps formed between the ends of metal lines in dielectric layer 110 are also 5 nm. The length L separating spacer 151 and spacer 152 may be 15 nm or less, so that a resulting metal island 165 formed in dielectric layer 110, as described further below, may have a length $L_m$ of 15 nm or less. The conformal layer 150, and by extension, the spacers 151 and 152, and masking layer 130 may be composed of the same material, for example a nitride-based dielectric material such as silicon nitride.

Figure 6:
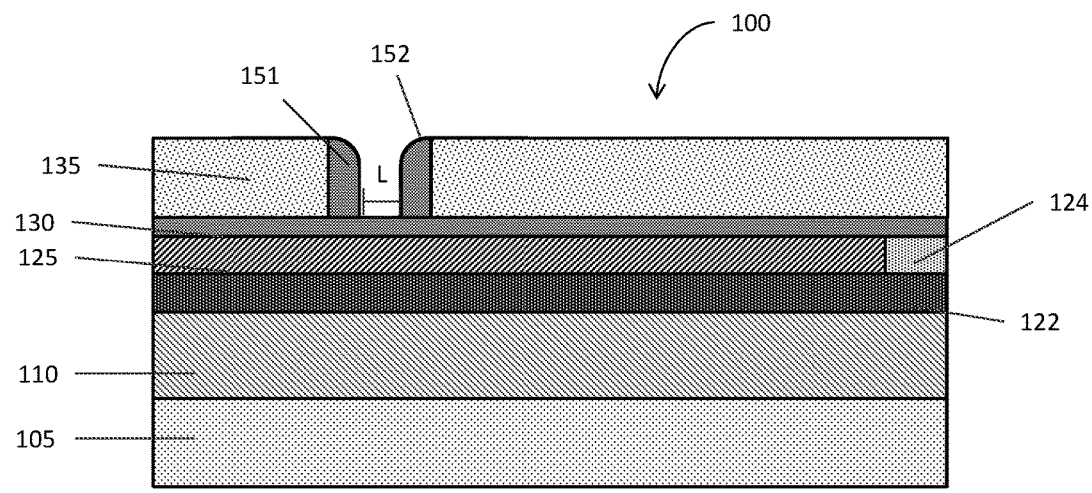
Figure 6A:
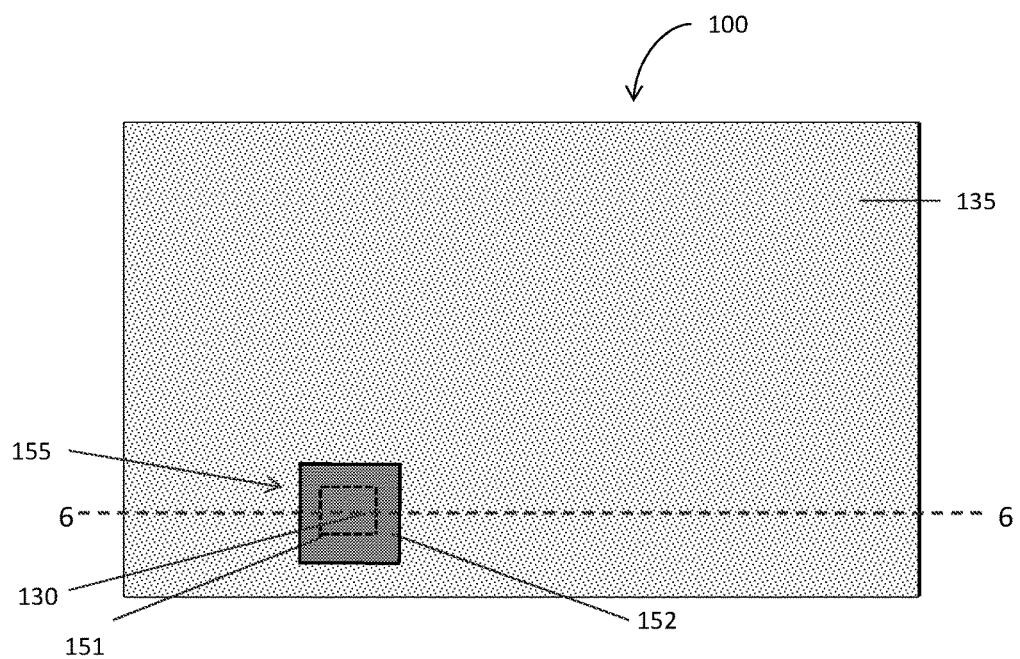

With reference to FIGS. 6 and 6A in which like reference numerals refer to like features in FIG. 5 and at a subsequent fabrication stage of the processing method, conformal layer 150 is removed from over spacer patterning layer 135, leaving spacer ring 155, including spacer 151 and spacer 152, disposed over the exposed portion of masking layer 130. The conformal layer 150 may be removed, for example, by a selective anisotropic etch process, such as a reactive-ion etch (RIE) process, controlled to terminate when spacer patterning layer 135 is exposed by the etch. A controlled anisotropic etch process allows for removal of the conformal layer 150 with minimal etching of spacers 151, 152. As FIG. 6A illustrates, the conformal layer 150 deposited on sidewalls of the opening 137 in spacer patterning layer 135 may form the spacer ring 155 or ring-like spacer formation, including the spacer 151 and spacer 152 that overlie and traverse dummy line 125.

Figure 7:
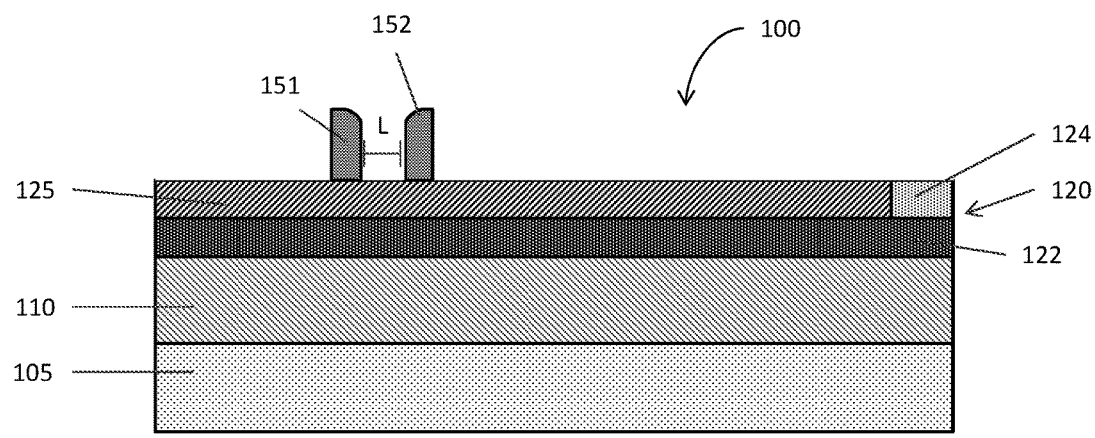
Figure 7A:
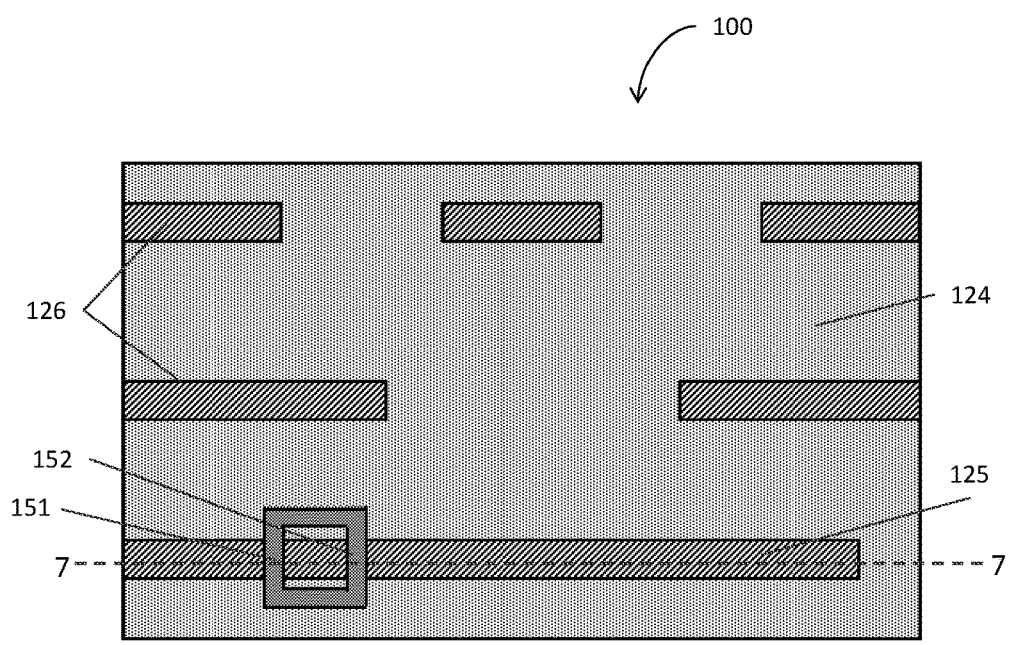

With reference to FIGS. 7 and 7A in which like reference numerals refer to like features in FIGS. 6 and 6A and at a subsequent fabrication stage of the processing method, spacer patterning layer 135 and masking layer 130 are removed, which leaves spacers 151 and 152 disposed over different sections of the dummy line 125. As FIGS. 7 and 7A show, spacer 151 and spacer 152 overly and traverse dummy line 125 in a spaced apart fashion. Spacer patterning layer 135 may be removed by a selective etch process that selectively removes the material of spacer patterning layer 135 without etching either the masking layer 130 or spacers 151, 152. Masking layer 130 may be etched by a selective etch process controlled to remove masking layer 130 without fully etching or removing spacer 151 and spacer 152, such as a reactive ion etching (RIE) process controlled to terminate when the dielectric layer 124 of patterning stack 120 is exposed by the etch process.

Figure 8:
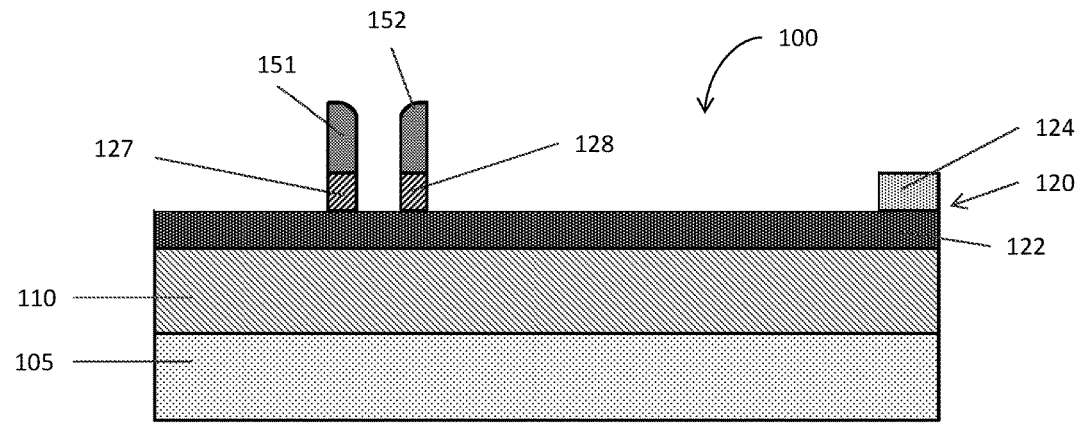
Figure 8A:
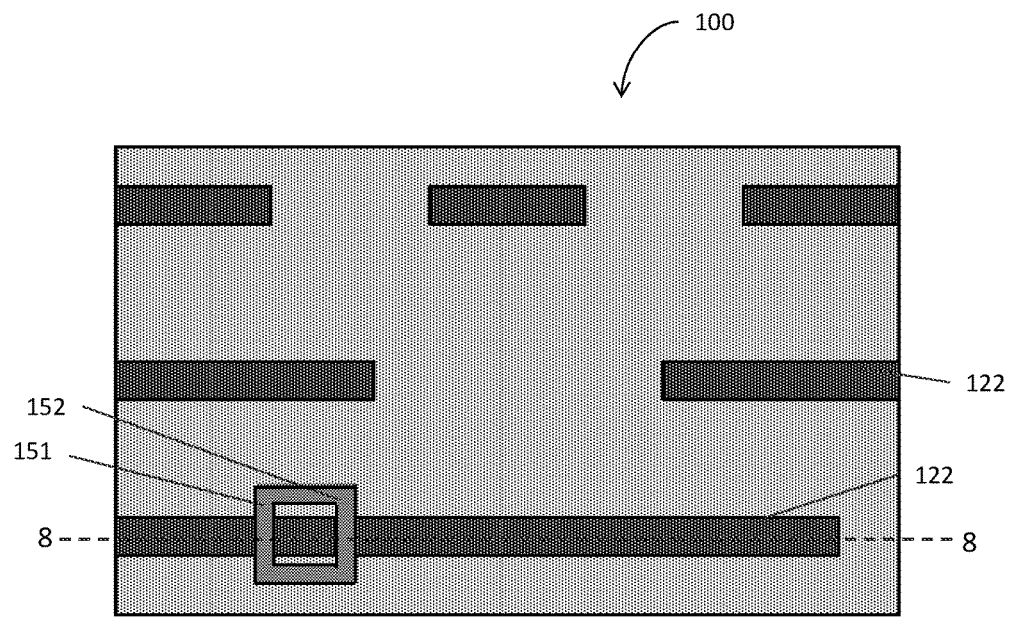

With reference to FIGS. 8 and 8A in which like reference numerals refer to like features in FIGS. 7 and 7A and at a subsequent fabrication stage of the processing method, dummy lines 125 and 126 are removed to expose underlying portions of hardmask layer 122. Spacer 151 and spacer 152 protect underlying portions 127, 128 of dummy line 125 from removal, so that in subsequent fabrication stages, as described below, the portions of hardmask layer 122 underlying the remaining portions 127, 128 of dummy line 125 will remain unetched and form "cuts" or gaps in a final metallization line to be formed in dielectric layer 110.

Figure 9:
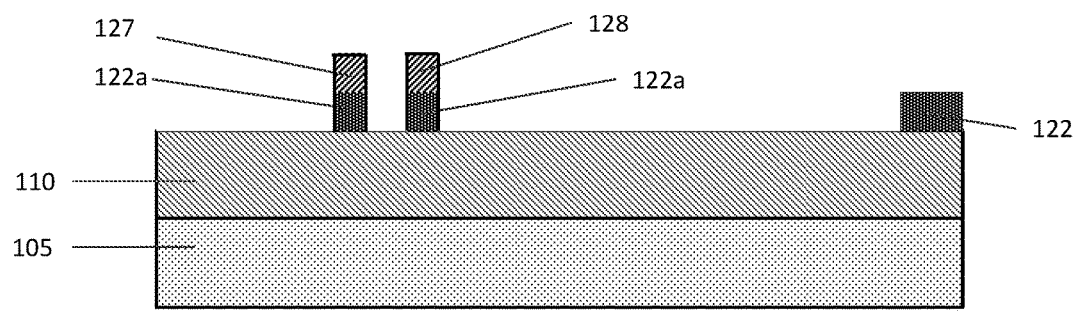
Figure 9A:
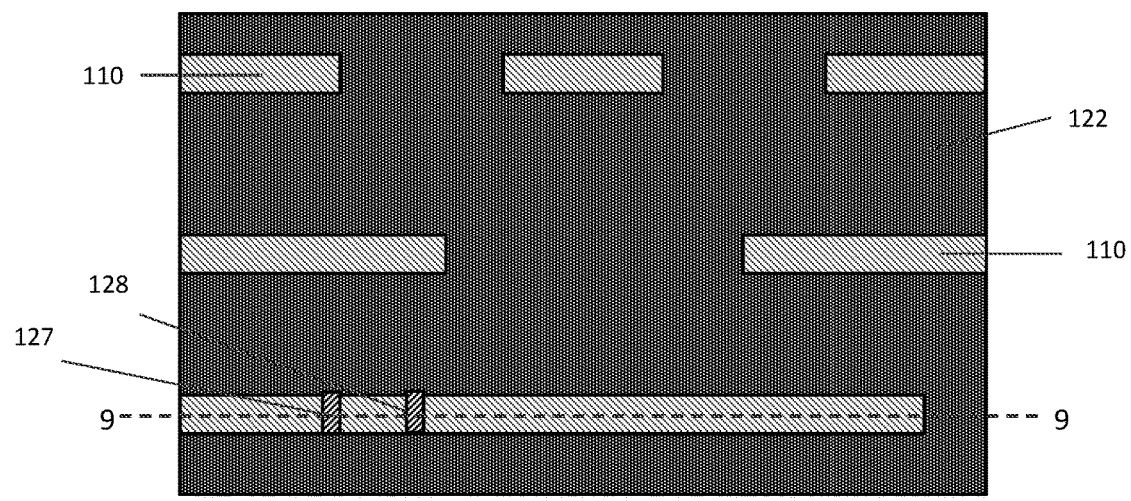

With reference to FIGS. 9 and 9A in which like reference numerals refer to like features in FIGS. 8 and 8A and at a subsequent fabrication stage of the processing method, the exposed portions of hardmask layer 122 are etched to form trenches in the hardmask layer 122 and expose portions of the dielectric layer 110 to be etched. Remaining portions of spacers 151 and 152 are also removed. The material of spacers 151 and 152, as well as other spacers of spacer ring 155, may be removed by, for example, a selective etch process. Dielectric layer 124 may be removed via a separate selective etch process, as illustrated in FIG. 9. Alternatively, dielectric layer 124 may remain to be etched during a subsequent etch of dielectric 110, illustrated in FIG. 10 and further described below. Remaining portions 127, 128 of dummy line 125 protect the underlying portions 122a, 122b of hardmask layer 122 and define gaps in the trenches formed in hardmask layer 122. Dummy lines 125, 126 may be removed, for example, by a selective anisotropic etch process such as a reactive ion etching (RIE) process.

Figure 10:
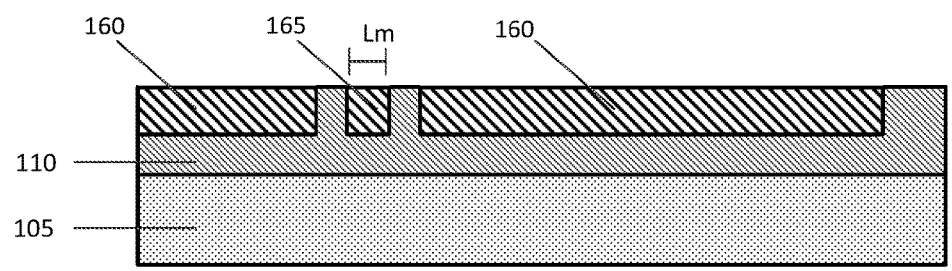
Figure 10A:
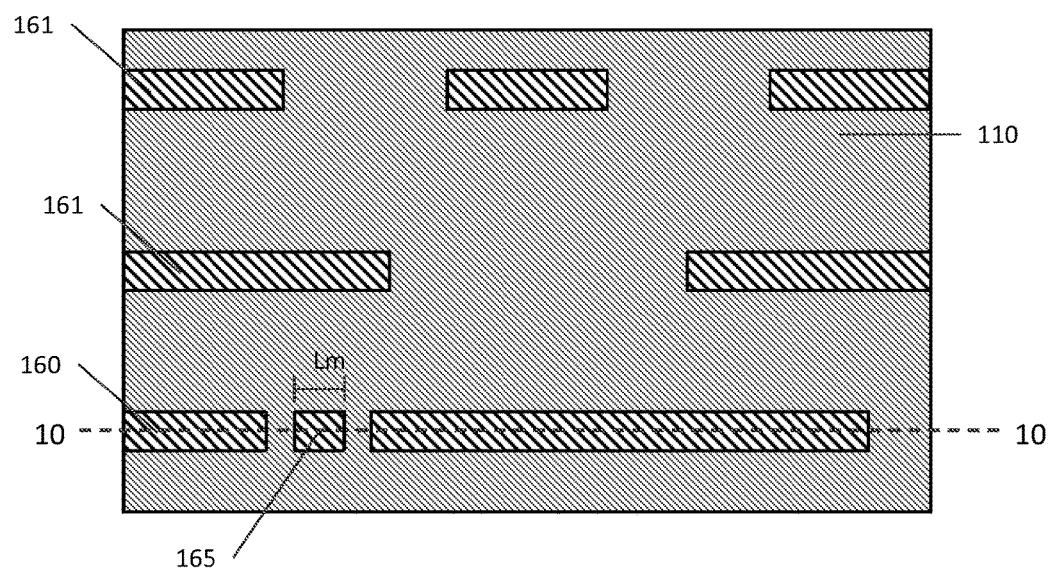

With reference to FIGS. 10 and 10A in which like reference numerals refer to like features in FIGS. 9 and 9A and at a subsequent fabrication stage of the processing method, metallization trenches are formed in dielectric layer 110 using the trenches etched in hardmask layer 122, and the trenches are filled with a conductive material to form metal lines 160, 161. Remaining portions of the hardmask layer 122 are removed, exposing the dielectric layer 110. Metal line 165, resulting from the cuts or gaps defined by the spacers 151 and 152 as described above, may be considered a "metal island" as it is electrically isolated from surrounding metal lines 160. The metal island 165 may have a length $L_m$ of 15 nm or less. The conductive material may be any conductive material, such as cobalt or ruthenium or copper or other conductive material used to form metal lines in a circuit structure. Cobalt may be a preferred conductive material for forming metal lines 160, 161 and metal island 165 because cobalt may be used to form very short metal lines, such as metal islands of 15 nm or less, whereas copper metal lines generally must have a minimum length that is greater than 15 nm due to the material properties of copper and due to reliability issues during service and use of an integrated circuit structure.

Figure 11:
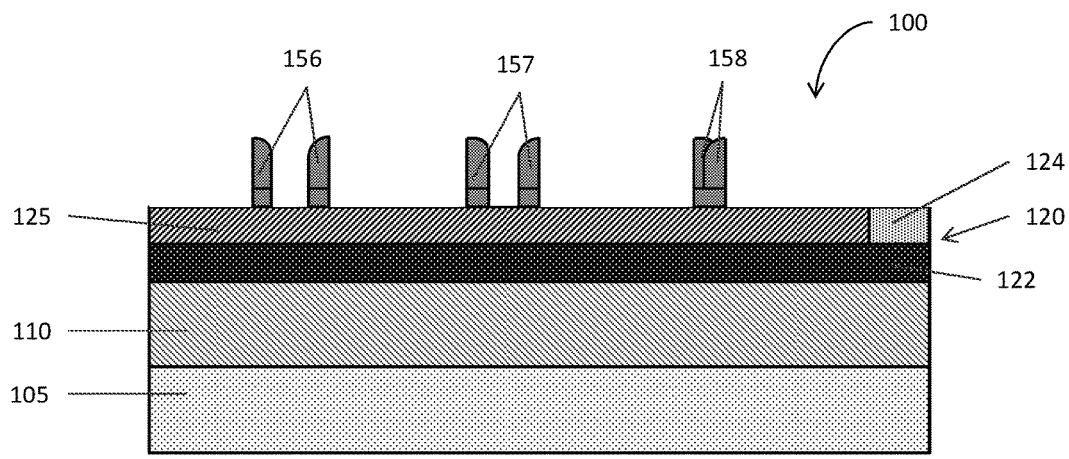
FIG. 11 is a cross-sectional view of a structure at an alternative fabrication stage following FIG. 6 of a processing method in accordance with embodiments of the invention.
Figure 11A:
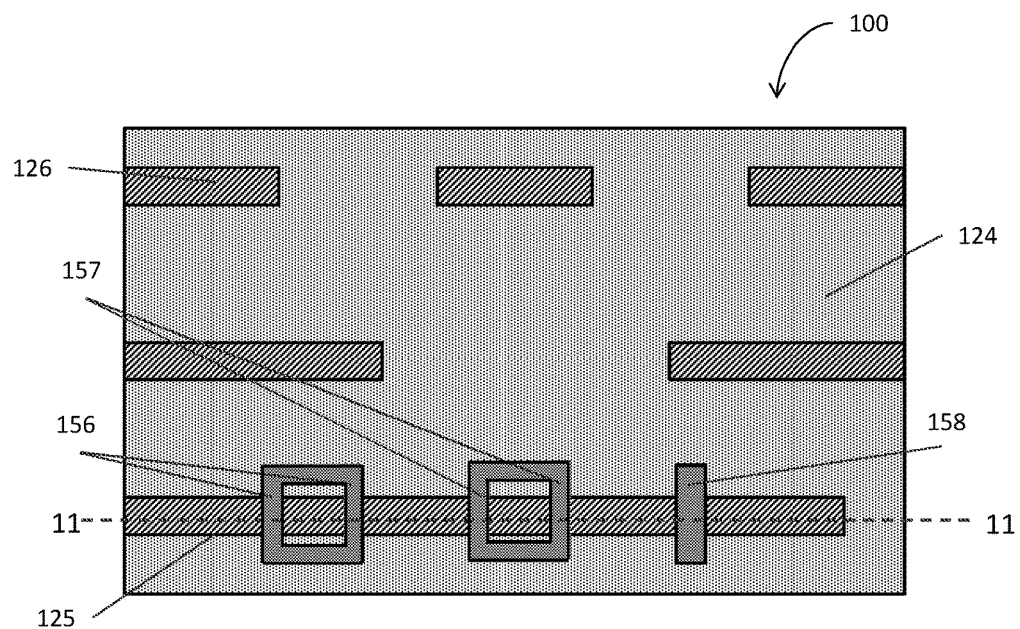

With reference to FIGS. 11 and 11A in which like reference numerals refer to like features in FIGS. 7 and 7A in a further embodiment of the processing method, multiple sets of spacers 156, 157, 158 may be formed over dummy line 125 to define multiple sets of cuts or gaps in the dummy line 125, and subsequently in metal lines formed in dielectric layer 110. Multiple sets of spacers 156, 157, 158 may be formed via a lithographic etch process, as described in part above, in which multiple openings are etched in spacer patterning layer 135 and the conformal layer 150 subsequently deposited over spacer patterning layer 135 forms multiple spacers 156, 157, 158. In embodiments in which an even number of cuts or gaps are needed in dummy line 125, multiple wider openings, similar to opening 137 in spacer patterning layer 135 depicted in FIGS. 4-5, may be formed in spacer patterning layer 135 that result in the formation of multiple spacer rings or ring-like spacers similar to the single spacer ring illustrated in FIGS. 5-6A. In embodiments in which an odd number of cuts or gaps in dummy line 125 are needed, multiple wider openings, similar to opening 137 in spacer patterning layer 135 depicted in FIGS. 4-5, may be formed in spacer patterning layer 135 that result in the formation of multiple spacer rings, and an additional narrow opening may be formed in spacer patterning layer 135 that results in spacers 158. The additional narrow opening in spacer patterning layer 135 may have a width dimension $W_N$ that is less than twice the thickness $T_3$ of the conformal layer 150 formed over the spacer patterning layer 135, resulting in spacers 158 that merge into a single spacer block disposed over dummy line 125. The single spacer block formed by spacers 158 then forms a single cut or gap in dummy line 125.

Figure 12:
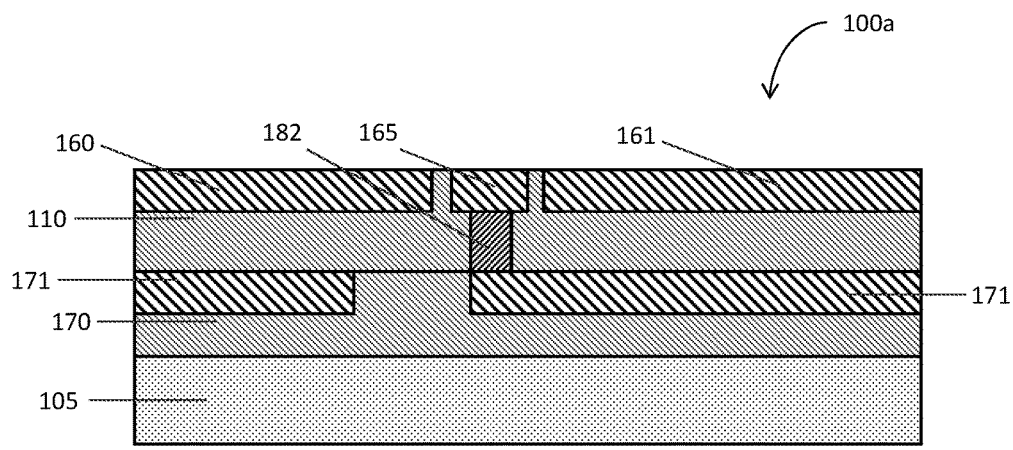
FIGS. 12 and 13 are cross-sectional views of the structure of FIGS. 1-10 at further fabrication stages of a processing method in accordance with embodiments of the invention.
Figure 13:
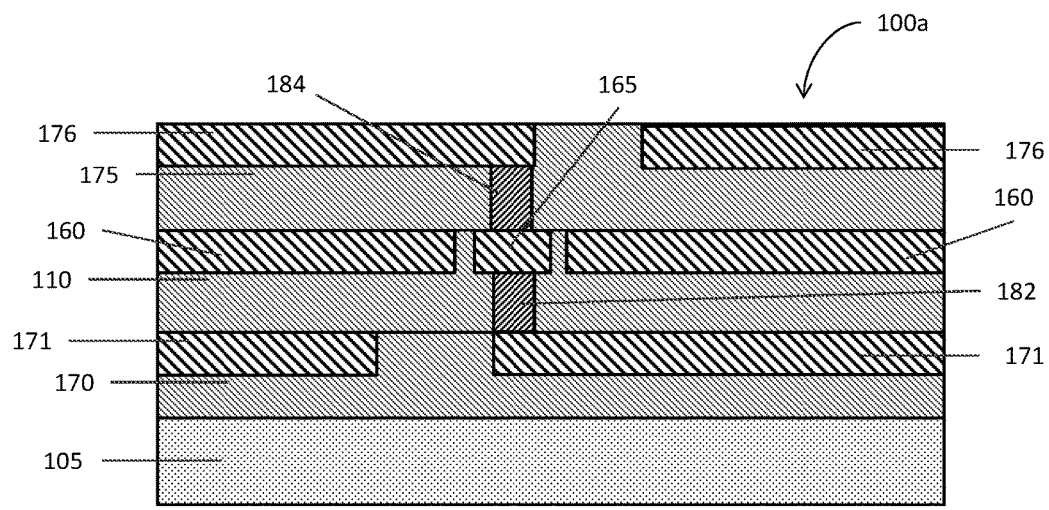

With reference to FIGS. 12 and 13 in which like reference numerals refer to like features in FIGS. 1-10A and in a further embodiment of the processing method, the dielectric layer 110, including metal lines 160, 161, and metal island 165, may be one metallization layer in a circuit structure 100a and may be disposed above a lower metallization layer 170 having a plurality of metal lines 171 and below an upper metallization layer 175 having a plurality of metal lines 176. As depicted in FIG. 12, a lower metallization layer 170 may be formed first and a via 182 formed to connect to one metal line 171 in lower metallization layer 170. The dielectric layer 110 may then be formed, as described above, with a metal island 165 aligned with the via 182 connected to metal line 171. Conductive via 182 may be formed, for example, by etching a hole through the dielectric material of dielectric layer 110, prior to formation of metal lines 160, 161, and metal island 165, and subsequently filling the hole with a conductive material such as cobalt, ruthenium, or copper. The conductive via 182 may be filled along with metal lines 160, 161, and metal island 165 in the same processing step or may be filled prior to forming metal lines 160, 161, and metal island 165 as described above. As depicted in FIG. 13, another conductive via 184 may then be formed that connects to metal island 165, and the upper metallization layer 175 may then be formed over dielectric layer 110 with one metal line 176 in upper metallization layer 175 aligned to and connecting with the other conductive via 184. Conductive via 184 may be formed by similar processes as for forming via 182. The circuit structure 100a formed thus has an interconnection between upper metallization layer 175 and lower metallization layer 170, wherein dielectric layer 110 separates the upper metallization layer 175 and lower metallization layer 170. Conductive vias 182 and 184, in conjunction with metal island 165 formed in dielectric layer 110, form an extended via or "super via" that permits interconnection between metal lines of non-adjacent metallization levels in circuit structure 100a. The metal island 165 formed as described herein allows for efficient conductive connection between conductive vias 182 and 184 as metal island 165 may be formed to have a size substantially equal to a size of conductive vias 182 and 184 so as to minimize area losses.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a patterning stack over a dielectric layer, wherein the patterning stack includes a dummy line;
    forming a masking layer over the patterning stack and a spacer patterning layer over the masking layer;
    etching an opening in the spacer patterning layer to expose a portion of the masking layer overlying the dummy line;
    forming a first spacer and a second spacer on the exposed portion of the masking layer at sidewalls of the opening, wherein the first spacer and the second spacer overlie and traverse respective first portions of the dummy line;
    removing the spacer patterning layer and the masking layer selective to the patterning stack, the first spacer, and the second spacer to expose second portions of the dummy line;
    removing the second portions of the dummy line selective to the first spacer and the second spacer to form a feature in the patterning stack that includes a first gap beneath the first spacer and a second gap beneath the second spacer; and
    forming a first metal line in the dielectric layer using the feature in the patterning stack,
    wherein the first metal line includes respective cuts at the first gap and the second gap in the feature in the patterning stack.

2. The method of claim 1 wherein forming the first spacer and the second spacer on the exposed portion of the masking layer at the sidewalls of the opening comprises:
    depositing a conformal layer on the spacer patterning layer and on the sidewalls of the opening, the conformal layer on the sidewalls of the opening defining the first spacer and the second spacer; and
    etching the conformal layer to expose the spacer patterning layer,
    wherein the etching is controlled to remove the conformal layer from over the spacer patterning layer without removing the first spacer and the second spacer.

3. The method of claim 2 wherein the conformal layer and the masking layer are composed of the same material.

4. The method of claim 2 wherein the conformal layer and the masking layer are composed of a nitride-based dielectric material.

5. The method of claim 2 wherein the conformal layer has a thickness selected to define a thickness of the first spacer and the second spacer, and the thickness of the first spacer and the second spacer defines a dimension of the first gap and the second gap in the feature in the patterning stack.

6. The method of claim 5 wherein the thickness of each of the first spacer and the second spacer is less than or equal to 5 nm.

7. The method of claim 1 wherein etching the opening in the spacer patterning layer comprises:
    forming a lithography stack over the spacer patterning layer;
    patterning an opening in the lithography stack that exposes a portion of the spacer patterning layer; and
    etching the exposed portion of the spacer patterning layer selective to the masking layer to form the opening in the spacer patterning layer.

8. The method of claim 1 wherein the spacer patterning layer is composed of an oxide-based dielectric material, and the masking layer is composed of a nitride-based dielectric material.

9. The method of claim 1 wherein the first spacer and the second spacer are separated by a length less than or equal to 15 nm.

10. The method of claim 1 wherein the patterning stack includes a hardmask arranged between the dummy line and the dielectric layer, and the feature is a trench in the hardmask that extends to the dielectric layer.

11. The method of claim 10 wherein forming the first metal line in the dielectric layer using the feature in the patterning stack comprises:
    etching portions of the dielectric layer exposed by the trench in the hardmask to form a trench in the dielectric layer; and
    depositing a metal in the trench in the dielectric layer.

12. The method of claim 11 wherein the metal is composed of cobalt or ruthenium.

13. The method of claim 11 wherein the cuts in the first metal line define a metal island as a section of the first metal line, and the cuts are filled by portions of the dielectric layer.

14. The method of claim 13 wherein the metal island has a length of less than or equal to 15 nm.

15. The method of claim 13 wherein the dielectric layer, the metal island, and the first metal line collectively form a first metallization layer, and further comprising:
    forming a second metallization layer disposed below the first metallization layer, the second metallization layer including a second metal line;
    forming a first conductive via aligned with and contacting the second metal line, the first conductive via contacting the metal island;
    forming a second conductive via contacting the metal island;
    forming a third metallization layer disposed above the first metallization layer, the third metallization layer including a third metal line, the third metal line aligned with and contacting the second conductive via.

16. The method of claim 15 wherein the metal island, the first conductive via, and the second conductive via are composed of the same material.

* * * * *